United States Patent

Kimura et al.

[11] Patent Number: 5,952,063
[45] Date of Patent: Sep. 14, 1999

[54] CRUCIBLE OF PYROLYTIC BORON NITRIDE FOR MOLECULAR BEAM EPITAXY

[75] Inventors: Noboru Kimura; Koji Hagiwara, both of Gunma-ken, Japan

[73] Assignee: Shin-Etsu Chemical Co., Ltd., Tokyo, Japan

[21] Appl. No.: 08/999,306

[22] Filed: Dec. 29, 1997

[30] Foreign Application Priority Data

Dec. 27, 1996 [JP] Japan .................................... 8-349808

[51] Int. Cl.$^6$ .................................................... B29D 22/00
[52] U.S. Cl. ........................ 428/34.1; 428/34.4; 118/726; 264/81; 427/255.2; 427/133; 433/265
[58] Field of Search .................................. 428/34.1, 34.4, 428/698; 118/726; 219/420, 421; 432/156, 265; 117/900; 427/255.2, 133; 264/81

[56] References Cited

U.S. PATENT DOCUMENTS 4,849,146  7/1989  Tanji ........................................... 264/81
5,759,646  6/1998  Kano ......................................... 428/34.4

Primary Examiner—Timothy Speer
Attorney, Agent, or Firm—McAulay Nissen Goldberg Kiel & Hand, LLP

[57] ABSTRACT

Disclosed is a crucible of pyrolytic boron nitride (PBN) for molecular beam epitaxy for melting of the source material, with which the troubles due to adhering of the molten source material in the form of drops caused on the quality of the epitaxial layer can be greatly decreased. Namely, the inner surface of the crucible is free from pits or other irregularities responsible to the adhering of the melt when the growth plane, which can be exposed by stripping of the surface layer of 0.50 mm thickness by cleavage, has a surface roughness Ra not exceeding 2.0 μm and Rmax not exceeding 18 μm. Such a PBN crucible can be prepared by the CVD method to deposit PBN on the surface of a graphite core of which the surface roughness Ra does not exceed 2 μm.

4 Claims, 2 Drawing Sheets

CRUCIBLE OF PYROLYTIC BORON NITRIDE FOR MOLECULAR BEAM EPITAXY

BACKGROUND OF THE INVENTION

The present invention relates to a crucible of pyrolytic boron nitride, hereinafter referred to as PBN, useful for melting a source material in the molecular beam epitaxy as well as a method for the preparation thereof. More particularly, the invention relates to a PBN crucible useful as a source-melting vessel in the molecular beam epitaxy and capable of giving an epitaxial layer having a greatly decreased number of defects due to disordered molecular beam ejection from the crucible caused by adhesion of the melt in drops to the inner surface of the crucible.

The above mentioned molecular beam epitaxy is a technology under rapid progress as a promising method for the formation of a thin layer of which the structure can be controlled in a thickness of only a few atoms. For example, technologies relative to a so-called superlattice layer which is a controlled stratification of layers consisting of atoms of the elements such as aluminum, gallium and arsenic are under energetic development works for the application as a high-speed transistor because the electron mobility therein can be larger by several times under certain conditions than in a conventional epitaxial layer consisting of the same elements.

The molecular beam epitaxy is a method in which a layer is formed by the deposition of atoms in the form of molecular beams on a substrate surface while the molecular beams are ejected from a molecular beam source which is a melt of the source material in a molecular beam cell such as a so-called Knudsen cell consisting of a crucible for melting of the source material, heater, reflector and temperature sensor such as a thermocouple. The material of the crucible for the molecular beam epitaxy having the largest versatility is PBN in respects of the high purity, excellent heat resistance, high mechanical strength and so on although the material should be selected depending on the source material to be melted in the crucible.

When a source material such as gallium is melted in a source crucible made from PBN for molecular beam epitaxy, a trouble is sometimes encountered that the melt of the source material adheres in drops to the inner surface of the crucible along or in the vicinity of the opening periphery of the crucible so that the molecular beams emitted from the bulk of the melt are greatly disturbed by the beams emitted from the drops of the melt adhering to the crucible walls resulting in occurrence of a great number of defects in the epitaxially grown layer formed by the molecular beam epitaxy. This problem of disordered molecular beams is particularly serious at the moment when the drops of the melt adhering to the inner wall surface of the crucible fall off the wall and drop to the bottom of the crucible or to the melt contained therein.

As a countermeasure to solve the above mentioned problems, a method is proposed to have the inner surface of a PBN crucible finished by mirror-polishing (see Preprints for the 52nd Scientific Lecture Symposium of the Society of Applied Physics, No. 2, page 488, 12P-P-13). This method, however, is far from satisfactory because no reproducible results can be obtained by the mirror-polish finishing of the crucible surface alone.

SUMMARY OF THE INVENTION

The present invention accordingly has an object to provide a novel and improved PBN crucible suitable as a source-melting vessel in the molecular beam epitaxy, with which a high-quality epitaxial layer can be formed by the molecular beam epitaxy as being freed from the above described problems and disadvantages encountered in the molecular beam epitaxy using a conventional PBN crucible as a source-melting vessel.

Thus, the crucible of the invention for use in the molecular beam epitaxy is a vessel made from pyrolytic boron nitride having such a structure of the wall that the surface formed by removing an inner surface layer of the crucible having a thickness of 0.5±0.1 mm by cleavage has a surface roughness Ra not exceeding 2.0 $\mu$m and Rmax not exceeding 18 $\mu$m.

The above defined unique PBN crucible of the invention can be prepared by a method which comprises the steps of:

(a) depositing pyrolytic boron nitride by the method of chemical vapor phase deposition onto the surface of a graphite core having an outer contour to be in conformity with the inner cavity of the crucible to form a layer of pyrolytic boron nitride in the form of a crucible;

(b) removing the graphite core from the layer of pyrolytic boron nitride in the form of a crucible; and (c) subjecting the layer of pyrolytic boron nitride in the form of a crucible to a baking treatment in an oxidizing atmosphere to oxidize away the carbonaceous material adhering to the surface of the boron nitride layer obtained in step (b), the graphite core used in step (a) having a surface roughness Ra not exceeding 2 $\mu$m.

Although the above defined PBN crucible prepared by the above described method is fully effective for decreasing occurrence of defects in the epitaxial layer formed by the molecular beam epitaxy by using the crucible, the improvement is more remarkable when the inner surface of the PBN crucible is finished by mirror-polishing to have a surface roughness Ra not exceeding 0.5 $\mu$m and Rmax not exceeding 4 $\mu$m on the area from the opening periphery of the crucible down to an approximately halfway of the depth of the crucible or, for example, down to the level below the opening periphery by 45% of the depth of the crucible.

DETAILED DESCRIPTION OF THE PREFERRED EMBODIMENTS

Figure 1:
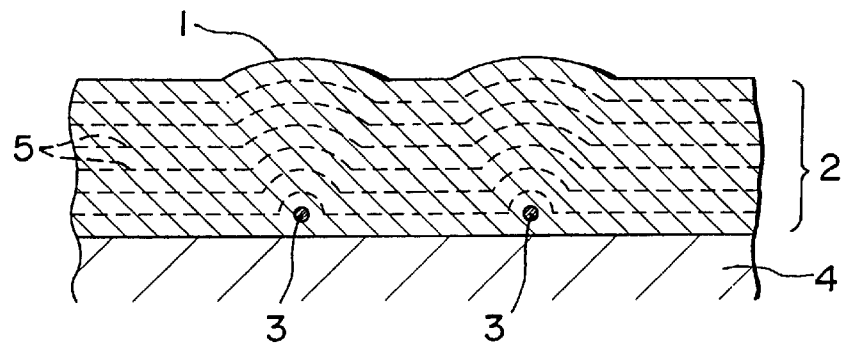
FIG. 1 is a schematic illustration of occurrence of bumps on the outer surface of the PBN layer when particulates are contained in the PBN to be deposited on the core surface by a vertical cross sectional view.
Figure 2:
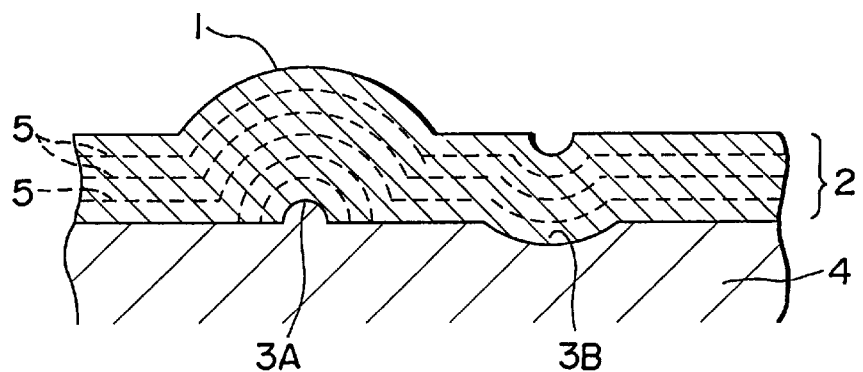
FIG. 2 is a schematic illustration of occurrence of bumps and recesses on the surface of the PBN layer when the surface of the graphite core is not smooth enough but has recesses and protrusions by a vertical cross sectional view.

In the following, an explanation is given by making reference to the accompanying drawing for the adhesion of melt drops onto the inner surface of a PBN crucible prepared by the method of chemical vapor phase deposition (CVD). As is well known, a PBN crucible is formed by the deposition of PBN formed in the vapor phase on the surface of a core of a refractory material such as graphite having a configuration in conformity with the inner cavity of the crucible. The PBN in the CVD method is formed in a low-pressure vapor phase of a gaseous mixture consisting of a boron source such as boron trifluoride, boron trichloride and boron tribromide and a nitrogen source such as ammonia, hydrazine and nitrogen gas in an appropriate mixing ratio and deposited, as is illustrated in FIGS. 1 and 2, on the surface of a graphite core 4 to form a layer 2 of the PBN as the wall of the crucible having a desired thickness. The PBN layer 2 has a laminar texture consisting of growth planes 5, as is shown by the dotted lines each generally in parallel to the surface of the graphite core 4 so that the PBN layer 2 is susceptible to cleavage, as is illustrated in FIG. 3, for example, by forcibly thrusting a knife edge 6 into the layer 2 in the direction along the surface 10.

When certain particulate bodies 3, such as dust particles floating in the atmosphere inside of the CVD chamber, enter the PBN to be deposited onto the graphite core 4, the particulates 3 are deposited on the surface of the graphite core 4 and act as a nucleus to disturb uniform deposition of the PBN from the vapor phase thus resulting in the formation of bumps 1 on the outer surface 11 of the PBN layer 2. The situation is similar, as is illustrated in FIG. 2, when, instead of deposition of particulates 3, the surface of the graphite core 4 is not smooth enough but has protrusions 3A and/or recesses 3B resulting in raised or depressed growth planes 5 of the laminar structure in the PBN layer 2. These surface irregularities can be clearly detected by projecting a beam of spotlight aslant to make a shadow of each of the bumps and recesses enabling recording of the sizes and numbers thereof.

Figure 4:
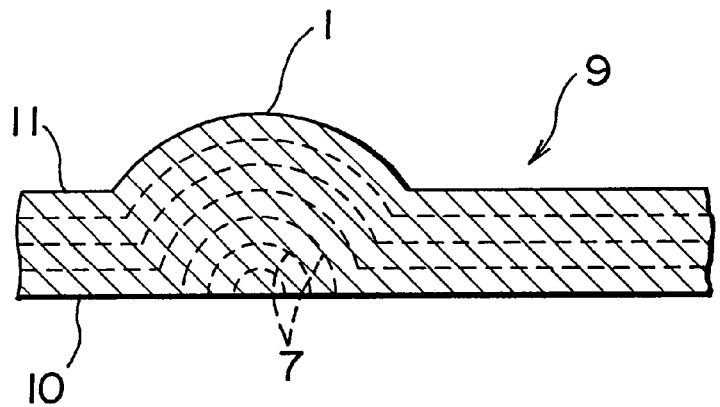
FIG. 4 is a schematic illustration for the occurrence of discontinuity exposed on the inner surface of the PBN crucible with a relatively large roughness of the growth plane by a vertical cross sectional view.
Figure 5:
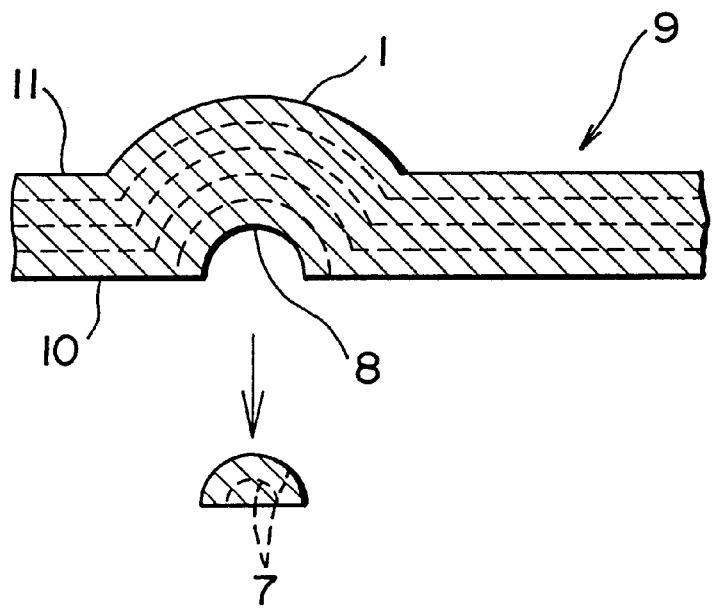
FIG. 5 is a schematic illustration for the occurrence of pits on the inner surface of the PBN crucible due to falling of the discontinuity bits off the growth plane in the PBN layer by a vertical cross sectional view.

It is sometimes the case that, when a number of relatively large bumps are formed in the PBN layer, a discontinuity 7 is formed in the growth plane appearing on the inner surface 10 of the PBN crucible as is illustrated in FIG. 4 and a bit of the PBN layer is eventually falls from the PBN wall as being separated along the discontinuous growth plane 7 to form a pit 8, as is illustrated in FIG. 5. This situation may explain the mechanism for increased wetting of the inner surface of the PBN crucible with the melt of the source material and adhesion of melt drops to the crucible surface.

Figure 3:
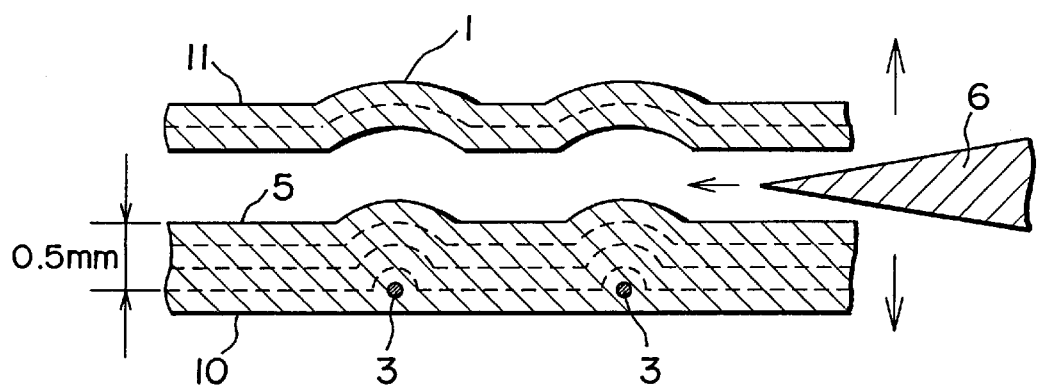
FIG. 3 is a schematic illustration of the method for obtaining a cleavage surface of the growth plane in a PBN layer by stripping with a knife edge by a vertical cross sectional view.

The condition of the growth plane of the PBN layer can be estimated as a surface roughness expressed by Ra and Rmax in the measurement of the surface roughness of the surface 5 formed by cleavage to strip off the surface layer of an appropriate thickness with a knife edge 6 as is illustrated in FIG. 3. According to the invention, the surface 5 formed by stripping of the surface layer having a thickness of 0.5±0.1 mm on the inner surface of the PBN crucible should have a surface roughness expressed by Ra and Rmax not exceeding 2.0 $\mu$m and 18 $\mu$m, respectively. When the surface roughness of the above defined growth plane exceeds the respective upper limits of Ra and Rmax, a remarkable increase is noted in the adhesion of the molten source material to the inner surface of the crucible resulting in an increase in the number of defects in the epitaxial layer formed by the molecular beam epitaxy using the crucible.

The surface 5 of the growth plane to be subjected to the measurement of the surface roughness by using a surface roughness tester can be formed by stripping off the surface layer on the inner surface 10 of the crucible wall having the specified thickness with a sharp knife edge 6.

The advantageous effect obtained by the use of the above defined PBN crucible in the molecular beam epitaxy can be further increased when the inner surface 10 of the PBN crucible is finished by mirror-polishing to have a surface roughness expressed by Ra and Rmax not exceeding 0.5 $\mu$m and 4 $\mu$m, respectively. It is not always necessary that whole inner surface of the PBN crucible is finished by mirror-polishing to have the above mentioned surface roughness but the mirror-polish finishing can be limited to the area on the inner surface 10 of the PBN crucible to an approximately halfway depth, e.g., 40 to 50%, of the crucible from the open periphery of the crucible since the phenomenon of melt drop adhesion takes place mainly on the area in the vicinity of the open periphery of the crucible.

The CVD process per se for the preparation of the PBN crucible for molecular beam epitaxy can be performed generally according to a known method. For example, a mixture of a nitrogen source gas such as ammonia and a boron source gas such as boron trichloride in an appropriate mixing ratio is introduced into a CVD chamber under a pressure of 10 Torr or lower and the gases are reacted at a temperature of about 1900° C. pyrolytically to produce boron nitride molecules which are deposited onto the surface of a core of a refractory material such as graphite having a configuration of the inner cavity of the crucible to form a layer of PBN until the thickness of the PBN layer reaches a desired value. It is essential that the graphite core used here has a surface roughness Ra not exceeding 2 $\mu$m. It is of course important that the atmosphere inside of the CVD chamber is free from any dust particles as far as possible. The introduction of the starting gases should be smooth and uniform in order to avoid irregular deposition of the PBN. After completion of the PBN layer to have a thickness of the crucible walls, the graphite core is removed from the PBN layer in the form of a crucible by a suitable mechanical means. It is more or less unavoidable that a small amount of graphite is left on the inner surface of the PBN crucible after mechanical removal of the graphite core so that the PBN crucible is subjected to a heating treatment in an oxidizing atmosphere of, for example, air with an object to oxidize away the graphite material remaining on the inner surface of the PBN crucible. Finally, the PBN crucible is finished, though optional, by an appropriate polishing means so that the inner surface on the upper half part may have the above mentioned surface roughness.

The molecular beam cell for molecular beam epitaxy, e.g., a Knudsen cell, can be prepared by assembling the above obtained PBN crucible with a heater, reflector and thermocouple. When the molecular beam epitaxy is performed by using this source cell melting the source material, e.g., gallium, in the PBN crucible according to the invention, little adhesion of the molten source material is found on the inner surface of the PBN crucible resulting in a great decrease in occurrence of defects in the epitaxial layer formed by the molecular beam epitaxy.

In the following, the present invention is described in more detail by way of Examples and Comparative Examples.

EXAMPLE 1

A graphite core having a diameter of 12 mm and length of 77 mm and having a surface roughness Ra of 1.5 $\mu$m was prepared by sintering a carbon-based composition consisting of carbon fibers and a binder resin. The graphite core was set in a CVD chamber and heated therein up to a temperature of 1900° C. under evacuation of the chamber. In the next place, gases of ammonia and boron trichloride as the source materials of PBN were introduced at rates of 4 liters/minute and 1 liter/minute, respectively, into the CVD chamber which was kept under a pressure of 10 Torr to effect pyrolytic reaction of the source materials for 20 hours so that a layer of PBN having a thickness of 0.8 mm was deposited on the surface of the graphite core in the form of a crucible, which was taken out of the CVD chamber and freed from the graphite core to give a PBN crucible having an outer diameter of 13.6 mm, inner diameter of 12.0 mm and depth of 77 mm. The thus obtained PBN crucible was subjected to a heating treatment in air for 3 hours at 800° C. to oxidize away the carbonaceous material adhering to the inner surface of the crucible after removal of the graphite core.

Finally, the inner surface of this PBN crucible was subjected to mirror-polishing by using a #1200 abrasive alumina powder to have a surface roughness Ra of 0.1 $\mu$m and Rmax of 1.4 $\mu$m.

The surface roughness of the growth plane of the PBN crucible was measured by stripping off the surface layer of 0.5 mm thickness with a knife edge as is illustrated in FIG. 3 at the area 20 mm below the open periphery of the crucible to obtain a surface roughness Ra of 1.3 $\mu$m and Rmax of 11.2 $\mu$m.

A GaAsAl epitaxial layer was formed by using three PBN crucibles each prepared in the above described manner. Thus, 0.34 g of metallic gallium was taken in one of the PBN crucibles, which was set in a molecular beam epitaxy chamber together with two more crucibles each containing elementary aluminum or arsenic, and heated at a rate of temperature elevation of 10° C./minute up to a temperature of 1000° C. under a vacuum pressure of $10^{-8}$ Torr to be kept at this temperature for 1 hour. The number of liquid gallium drops adhering to the inner surface of the PBN crucible was 2 drops/cm$^2$. Further, inspection was made of the thus obtained GaAsAl epitaxial layer to find that the number of defects in the epitaxial layer was 10 defects/cm$^2$.

EXAMPLE 2

The experimental procedure was substantially the same as in Example 1 excepting for the omission of the mirror-polishing with an abrasive alumina powder to finish the inner surface of the PBN crucible, of which the growth plane of the PBN layer exposed by cleavage of the surface layer had a surface roughness Ra and Rmax of 1.4 $\mu$m and 12.3 $\mu$m, respectively. The surface roughness Ra and Rmax of the inner surface of the PBN crucible was 0.7 $\mu$m and 8.6 $\mu$m, respectively.

The number of adhering liquid gallium drops was 5 drops/cm$^2$ on the inner surface of the crucible in the test of molecular beam epitaxy using the PBN crucible. The number of defects in the GaAsAl epitaxial layer obtained by the molecular beam epitaxy was 35 defects/cm$^2$.

COMPARATIVE EXAMPLE 1

The experimental procedure was substantially the same as in Example 1 except that the graphite core for the CVD preparation of a PBN crucible had a surface roughness Ra of 2.5 $\mu$m. The surface roughness of the growth plane of the PBN layer Ra and Rmax was 2.8 $\mu$m and 22.4 $\mu$m, respectively. The surface roughness Ra and Rmax of the inner surface of the finished PBN crucible was 0.2 $\mu$m and 2.5 $\mu$m, respectively.

The number of adhering liquid gallium drops was 14 drops/cm$^2$ on the inner surface of the crucible in the test of molecular beam epitaxy using the PBN crucible. The number of defects in the GaAsAl epitaxial layer obtained by the molecular beam epitaxy was 95 defects/cm$^2$.

COMPARATIVE EXAMPLE 2

The experimental procedure was substantially the same as in Example 2 except that the graphite core for the CVD preparation of a PBN crucible had a surface roughness Ra of 2.5 $\mu$m. The surface roughness of the growth plane of the PBN layer Ra and Rmax was 2.6 $\mu$m and 20.1 $\mu$m, respectively. The surface roughness Ra and Rmax of the inner surface of the PBN crucible was 1.1 $\mu$m and 15.3 $\mu$m, respectively.

The number of adhering liquid gallium drops was 35 drops/cm$^2$ on the inner surface of the crucible in the test of molecular beam epitaxy using the PBN crucible. The number of defects in the GaAsAl epitaxial layer obtained by the molecular beam epitaxy was 500 defects/cm$^2$.

What is claimed is:

1. A crucible of pyrolytic boron nitride for molecular beam epitaxy comprising a wall having:
   a thickness substantially larger than 0.5±0.1 mm,
   an inner surface, and
   an interior structure such that removing a layer having a thickness of 0.5±0.1 mm from the inner surface by cleavage would produce a cleavage wall surface having a surface roughness Ra not exceeding 2.0 $\mu$m and Rmax not exceeding 18 $\mu$m.

2. The crucible of pyrolytic boron nitride for molecular beam epitaxy as claimed in claim 1, wherein the inner surface has a surface roughness of Ra not exceeding 0.5 $\mu$m and Rmax not exceeding 4 $\mu$m at least in the vicinity of the open periphery of the crucible.

3. A method for the preparation of a crucible of pyrolytic boron nitride for molecular beam epitaxy which comprises the steps of:
   (a) depositing pyrolytic boron nitride by the method of chemical vapor phase deposition from a gaseous mixture of a nitrogen source gas and a boron source gas onto the surface of a graphite core having an outer contour to be in conformity with the inner cavity of the crucible to form a layer of pyrolytic boron nitride in the form of a crucible;
   (b) mechanically removing the graphite core from the layer of pyrolytic boron nitride in the form of a crucible; and
   (c) subjecting the layer of pyrolytic boron nitride in the form of a crucible to a heating treatment in an oxidizing atmosphere to oxidize away the carbonaceous material adhering to the surface of the boron nitride layer obtained in step (b),
   the graphite core used in step (a) having a surface roughness Ra not exceeding 2 $\mu$m.

4. The method for the preparation of a crucible of pyrolytic boron nitride as claimed in claim 3 in which step (c) is followed by step (d) of polishing the inner surface of the crucible of pyrolytic boron nitride to have a surface roughness Ra not exceeding 0.5 $\mu$m and Rmax not exceeding 4 $\mu$m at least in the vicinity of the open periphery of the crucible.

* * * * *